(12) United States Patent
Seki

(10) Patent No.: US 10,971,899 B2
(45) Date of Patent: Apr. 6, 2021

(54) LASER LIGHT SOURCE UNIT

(71) Applicant: Mitsubishi Electric Corporation, Tokyo (JP)

(72) Inventor: Toshihide Seki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/476,206

(22) PCT Filed: Mar. 6, 2017

(86) PCT No.: PCT/JP2017/008723
§ 371 (c)(1),
(2) Date: Jul. 5, 2019

(87) PCT Pub. No.: WO2018/163235
PCT Pub. Date: Sep. 13, 2018

(65) Prior Publication Data
US 2020/0388992 A1 Dec. 10, 2020

(51) Int. Cl.
*H01S 5/40* (2006.01)
*H01S 5/042* (2006.01)
*H01S 5/022* (2021.01)
*H01S 5/02212* (2021.01)
*H01S 5/0237* (2021.01)

(52) U.S. Cl.
CPC .......... *H01S 5/4018* (2013.01); *H01S 5/0237* (2021.01); *H01S 5/02212* (2013.01); *H01S 5/04257* (2019.08); *H01S 5/4025* (2013.01)

(58) Field of Classification Search
CPC .............. H01S 5/4018; H01S 5/04257; H01S 5/02212; H01S 5/02272; H01S 5/4025
See application file for complete search history.

(56) References Cited

U.S. PATENT DOCUMENTS 6,396,857 B1 * 5/2002 Labranche .......... H01S 5/02272
257/719
2005/0047456 A1 3/2005 Rice
2014/0119394 A1 5/2014 Schleuning et al.

FOREIGN PATENT DOCUMENTS

JP 2012-9760 A 1/2012
JP 2012-156233 A 8/2012

OTHER PUBLICATIONS

International Search Report issued in PCT/JP2017/008723 (PCT/ISA/210), dated May 23, 2017.
Extended European Search Report issued in corresponding European Application No. 17899990.0 dated Feb. 20, 2020.
Office Action issued in corresponding Chinese Application No. 201780087659.7 dated Jun. 22, 2020.
Canadian Office Action for Canadian Application No. 3,048,726, dated Dec. 1, 2020.

* cited by examiner

*Primary Examiner* — Armando Rodriguez
(74) *Attorney, Agent, or Firm* — Birch, Stewart, Kolasch & Birch, LLP.

(57) ABSTRACT

A housing 10 is provided with a groove V1a into which an electrode 3b of a laser oscillation element 30a and an electrode 3a of a laser oscillation element 30b are inserted. Inside the groove V1a, there exists a conductive layer 12 configured to electrically connect the electrode 3b of the laser oscillation element 30a and the electrode 3a of the laser oscillation element 30b.

9 Claims, 5 Drawing Sheets

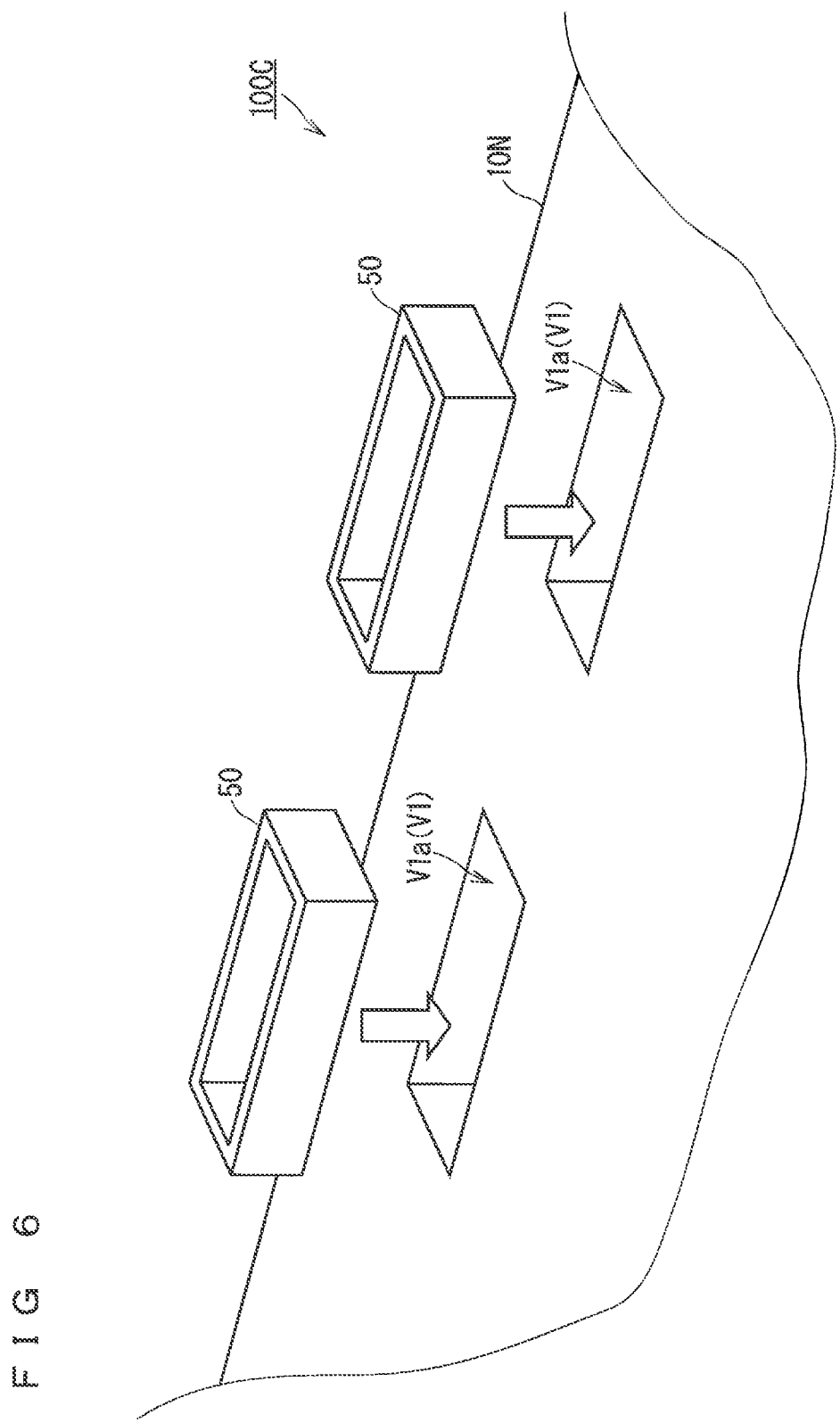

LASER LIGHT SOURCE UNIT

TECHNICAL FIELD

The present invention relates to a laser light source unit including a plurality of laser oscillation elements.

BACKGROUND ART

In recent years, as a light source of a projection-type display apparatus such as a projector or the like, a laser oscillation element such as a semiconductor laser or the like has been attracting attention. The laser oscillation element has excellent characteristics in a monochromaticity of oscillated light, and a high directivity of the light. Moreover, the laser oscillation element has a merit of being driven with a lower power consumption. Thus, the laser oscillation element is expected as a light source that will replace a lamp currently widespread.

However, it is difficult to cause the one laser oscillation element to generate a necessary light quantity for the projection-type display apparatus. Therefore, in the projection-type display apparatus, generally, a light source configured of a plurality of laser oscillation elements is used.

In Patent Documents 1, 2, there has been disclosed a technique in which in a projector (projection-type display apparatus), a light source configured of a plurality of laser oscillation elements (semiconductor lasers) is used. In the following description, a technique described in Patent Document 1 is also referred to as a "related art A." Moreover, in the following description, a technique described in Patent Document 2 is referred to as a "related art B."

PRIOR ART DOCUMENTS

Patent Documents

Patent Document 1: Japanese Patent Application Laid-Open No. 2012-009760

Patent Document 2: Japanese Patent Application Laid-Open No. 2012-156233

SUMMARY

Problem to be Solved by the Invention

In a laser light source unit such as a light source apparatus including a plurality of laser oscillation elements (semiconductor lasers), simplification of a configuration has been demanded for cost reduction. In the related arts A, B, since a substrate is required for driving the plurality of laser oscillation elements (semiconductor lasers), the above-described demand cannot be satisfied.

The present invention is achieved to solve the above-described problem, and an object of the present invention is to provide a laser light source unit having a configuration simplified.

Means to Solve the Problem

In order to achieve the above-described object, a laser light source unit according to one aspect of the present invention includes first and second laser oscillation elements; and a housing configured to hold the first and second laser oscillation elements, wherein each of the first and second oscillation elements has a first electrode and a second electrode, the housing is provided with a groove into which the second electrode of the first laser oscillation element, and the first electrode of the second laser oscillation element are inserted, and inside the groove, a conductive layer exists, the conductive layer being configured to electrically connect the second electrode of the first laser oscillation element, and the first electrode of the second laser oscillation element.

Effects of the Invention

According to the present invention, in the housing, the groove into which the second electrode of the first laser oscillation element, and the first electrode of the second laser oscillation element are inserted is provided. Inside the groove, the conductive layer configured to electrically connect the second electrode of the first laser oscillation element and the first electrode of the second laser oscillation element exists.

Thereby, the second electrode of the first laser oscillation element and the first electrode of the second laser oscillation element are electrically connected inside the groove of the housing without using a substrate. Thus, the laser light source unit having the configuration simplified can be provided.

The objects, features, aspects, and advantages of the present invention will become more apparent from the following detailed description and the accompanying drawings.

BRIEF DESCRIPTION OF DRAWINGS

FIG. 6 is a perspective view showing a part of a configuration of a laser light source unit according to a fourth embodiment of the present invention.

DESCRIPTION OF EMBODIMENTS

Hereinafter, embodiments of the present invention will be described with reference to the drawings. In the following drawings, the same components are denoted by the same reference signs. Names and functions of the components by the same reference sign are the same. Therefore, detailed descriptions of a part of the components denoted by the same reference sign may be omitted.

It should be noted that dimensions, materials, and shapes of the components exemplified in the embodiments, relative positions of the components, and the like may be appropriately changed according to a configuration of an apparatus to which the present invention is applied, various conditions, and the like. Moreover, the dimensions of each of the components in each of the drawings may be different from actual dimensions.

First Embodiment

Figure 1:
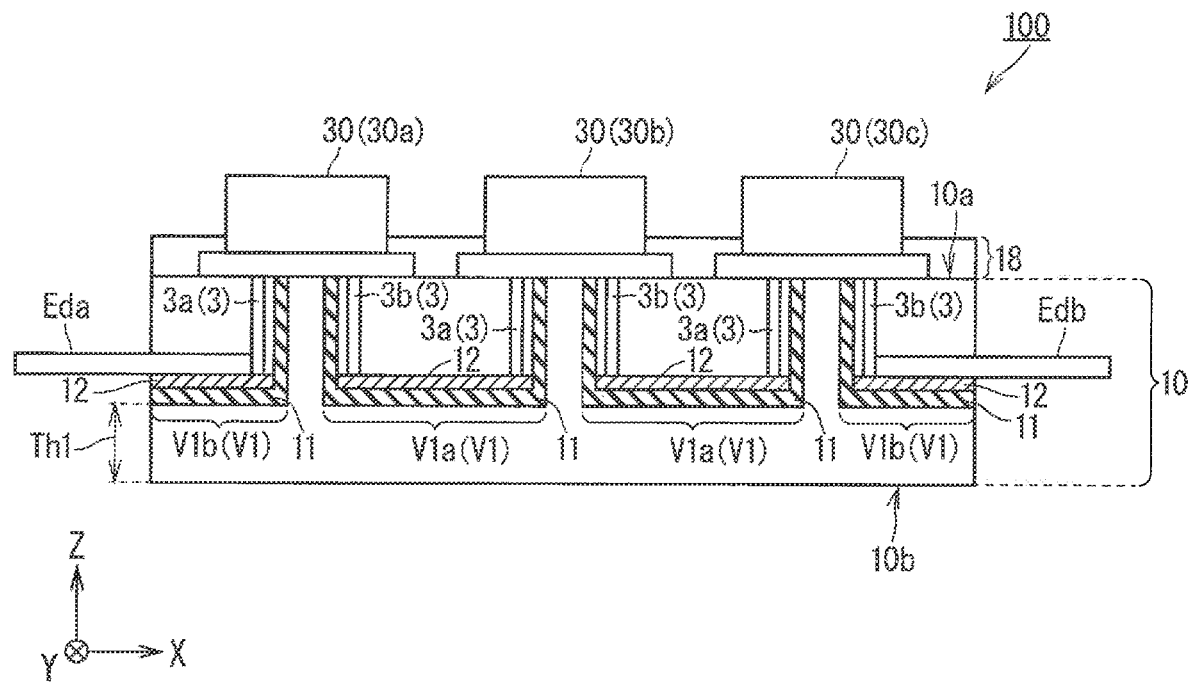
FIG. 1 is a cross-sectional view of a laser light source unit according to a first embodiment of the present invention.

FIG. 1 is a cross-sectional view of a laser light source unit 100 according to a first embodiment of the present invention. The laser light source unit 100 is, for example, a unit used as a light source of a projector.

In FIG. 1, an X direction, a Y direction, and a Z direction are orthogonal to one another. The X direction, the Y direction, and the Z direction shown in the following figures are also orthogonal to one another. In the following description, a direction including the X direction and a direction opposite to the X direction (−X direction) is also referred to as an "X axis direction." Moreover, in the following description, a direction including the Y direction and a direction opposite to the Y direction (−Y direction) is also referred to as a "Y axis direction." Moreover, in the following description, a direction including the Z direction and a direction opposite to the Z direction (−Z direction) is also referred to as a "Z axis direction."

Moreover, in the following description, a plane including the X axis direction and the Y axis direction is also referred to as an "XY plane." In the following description, a plane including the X axis direction and the Z axis direction is also referred to as an "XZ plane." In the following description, a plane including the Y axis direction and the Z axis direction is also referred to as a "YZ plane."

Referring to FIG. 1, the laser light source unit 100 includes n laser oscillation elements 30, a housing 10, a fixing member 18, and electrodes Eda, Edb. "n" denotes a natural number of two or more. In the present specification, as one example, it is assumed that "n" is six. That is, the laser light source unit 100 includes the six laser oscillation elements 30. In the following description, the n laser oscillation elements 30 included by the laser light source unit 100 are also referred to as "laser oscillation elements 30a, 30b, 30c, 30d, 30e, 30f." Note that "n" is not limited to six, and "n" may be any of two to five, or seven or more.

Figure 2:
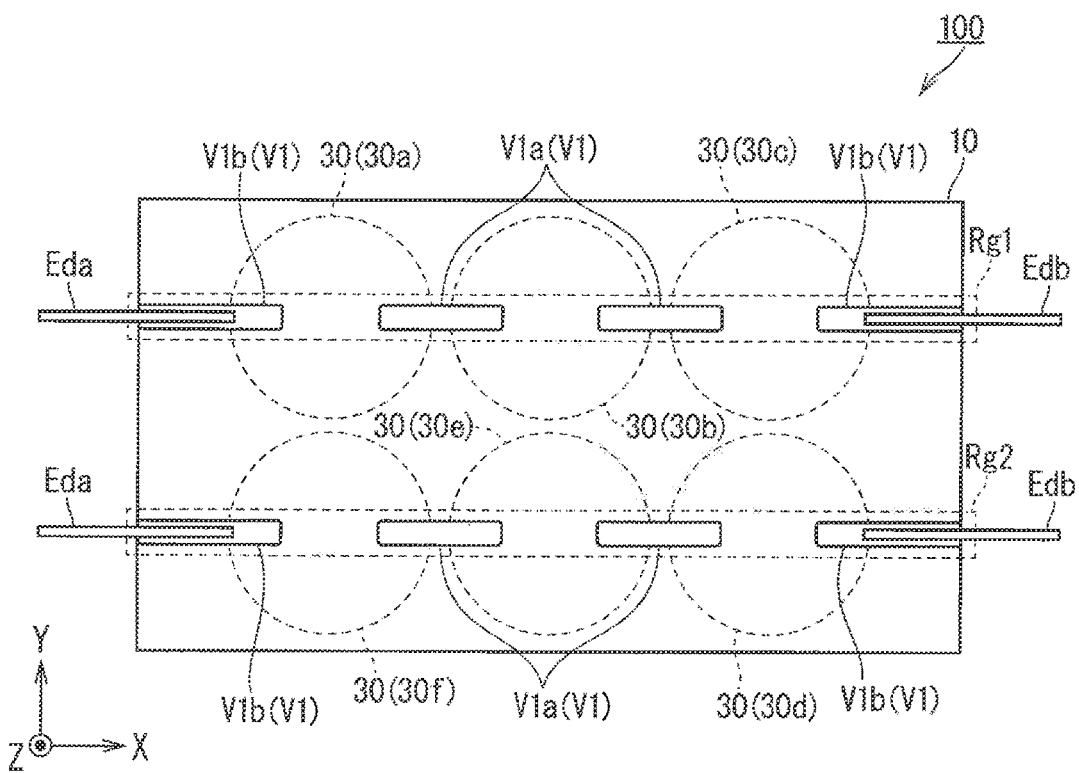
FIG. 2 is a plan view showing a configuration of the laser light source unit according to the first embodiment of the present invention.

FIG. 2 is a plan view showing a configuration of the laser light source unit 100 according to the first embodiment of the present invention. In order to facilitate understanding of features of the first embodiment, in FIG. 2, outlines of the laser oscillation elements 30a, 30b, 30c, 30d, 30e, 30f are indicated by dotted lines, and the fixing member 18 described later is not shown.

Figure 3A:
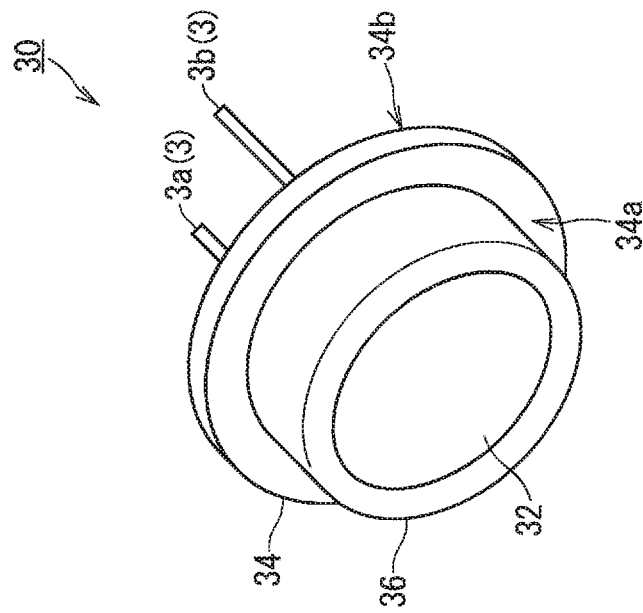
FIGS. 3A and 3B are views showing an external appearance of a laser oscillation element according to the first embodiment of the present invention.
Figure 3B:
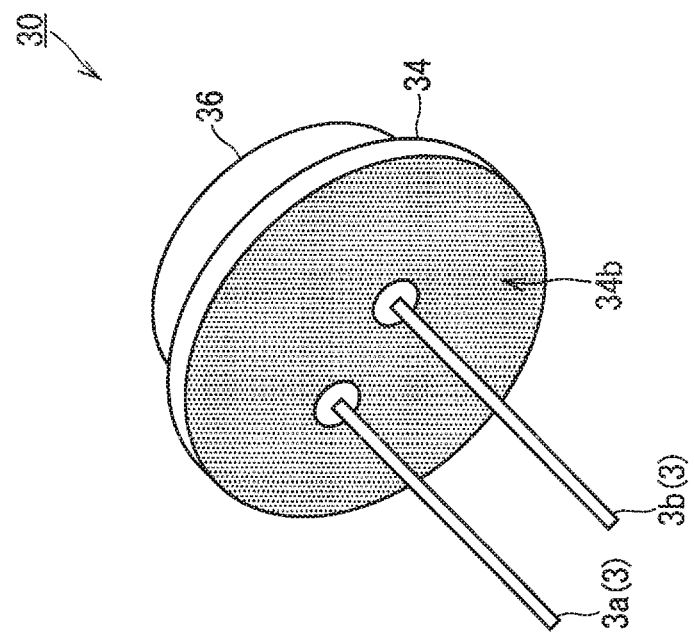

FIGS. 3A and 3B are views of an external appearance of each of the laser oscillation elements 30 according to the first embodiment of the present invention. The laser oscillation element 30 is an element configured to oscillate (emit) laser light. In the following description, a surface where the laser light is oscillated in the laser oscillation element 30 is also referred to as an "optical oscillation surface." FIG. 3A is a perspective view mainly showing the optical oscillation surface of the laser oscillation element 30. FIG. 3B is a perspective view mainly showing a bottom surface side of the laser oscillation element 30. Descriptions of a laser element (not shown) existing inside the laser oscillation element 30, a structure of the laser oscillation element 30, and operation principles and the like of the laser oscillation element 30 are omitted.

Referring to FIGS. 1, 3A, and 3B, the laser oscillation element 30 has glass 32, a stem 34, a cap 36, electrodes 3a, 3b, and the laser element (not shown).

The stem 34 is a plate-shaped member. The stem 34 has a main surface 34a and a cooling surface 34b as a back surface. In the main surface 34a of the stem 34, the laser element (not shown) is provided. The cooling surface 34b is a surface for cooling the laser oscillation element 30.

The cap 36 is a member configured to contain the laser element. The cap 36 is fixed to the main surface 34a of the stem 34 so that the cap 36 contains the laser element. That is, the laser element is sealed by the cap 36. In an upper surface of the cap 36, an opening is provided. The glass 32 has a light-transmitting property. The glass 32 is provided in the cap 36 so as to close the opening of the cap 36.

The laser oscillation element 30 is an element configured to drive, utilizing the electrode 3a and the electrode 3b. Specifically, current is supplied to the laser element, utilizing the electrodes 3a, 3b. Supplying the current to the laser element allows the laser element to oscillate (emit) the laser light. The laser light is emitted to an outside through the glass 32. In the following description, each of the electrodes 3a, 3b is also referred to as an "electrode 3." A shape of the electrode 3 is a rod shape.

Furthermore, referring to FIGS. 1 and 2, a shape of the housing 10 is a rectangular parallelepiped as one example. A shape of the housing 10 in planar view (XY plane) is an elongated shape (oblong). The housing 10 is made of, for example, metal. The housing 10 has an upper surface 10a and a back surface 10b. The back surface 10b is a flat surface. The back surface 10b functions as a cooling surface for cooling the housing 10.

While details will be described later, the housing 10 holds the n laser oscillation elements 30. The housing 10 is provided with a plurality of grooves V1a and a plurality of grooves V1b. In FIG. 2, as an example, four grooves V1a and four grooves V1b are shown. In the following description, each of the grooves V1a and the grooves V1b is also referred to as a "groove V1." A shape of the groove V1 in planar view (XY plane) is an elongated shape (oblong).

Referring to FIG. 2, the housing 10 has elongated regions Rg1, Rg2. In each of the regions Rg1, Rg2 of the housing 10, the four grooves V1 arranged linearly are provided. The four grooves V1 in each of the regions Rg1, Rg2 are the groove V1b, the two grooves V1a, and the groove V1b. That is, at one end portion of the housing 10, the two grooves V1b are provided. At another end portion of the housing 10, the two grooves V1b are provided.

Each of the grooves V1 is provided in an upper portion of the housing 10 (an upper surface 10a side). While details will be described later, each of the grooves V1 is a groove into which the electrodes 3 of the laser oscillation elements 30 are inserted.

The housing 10 is provided with the four grooves V1a and the four grooves V1b as one example. The grooves V1a are configured so that the plurality of laser oscillation elements 30 can be arranged at constant intervals. A shape and a position of each of the grooves V1a are set in view of an outer shape of the laser oscillation element 30, and an interval between the electrode 3a and the electrode 3b. Moreover, a depth of each of the grooves V1a is set in view of a length of the electrodes 3. Each of the grooves V1a is configured so that the groove V1a does not penetrate the housing 10.

In the two grooves V1b included in each of the regions Rg1, Rg2, the electrode Eda and the electrode Edb are provided, respectively. The electrode Eda and the electrode Edb are electrodes for supplying the current to the plurality of laser oscillation elements 30. The electrodes Eda, Edb are provided to make easy electrical connection between the electrodes Eda, Edb, and the plurality of laser oscillation elements 30. Shapes, sizes and the like of the electrodes Eda, Edb are decided so as to match a form of the projector equipped with the laser light source unit 100. Moreover, depending on the form of the projector equipped with the laser light source unit 100, necessity of the electrodes Eda, Edb is also decided.

In the region Rg1 of the housing 10, the laser oscillation elements 30a, 30b, 30c are arranged. In the region Rg2 of the housing 10, the laser oscillation elements 30d, 30e, 30f are arranged.

Note that FIG. 1 is a cross-sectional view of the laser light source unit 100 corresponding to the region Rg1 in FIG. 2. The electrodes 3a, 3b of each of the laser oscillation elements 30a, 30b, 30c stride over a region between the adjacent two grooves V1. For example, the electrodes 3a, 3b of the laser oscillation element 30a are inserted into the adjacent grooves V1b, V1a, respectively. Moreover, for example, the electrodes 3a, 3b of the laser oscillation element 30b are inserted into the adjacent two grooves V1a, respectively.

The electrode 3b of one of the adjacent two laser oscillation elements 30 and the electrode 3a of the other of the two laser oscillation elements 30 are inserted into the groove V1a of the housing 10. For example, the electrode 3b of the laser oscillation element 30a and the electrode 3a of the laser oscillation element 30b are inserted into the groove V1a.

Inside the groove V1a, a conductive layer 12 and an insulating layer 11 are provided. That is, inside the groove V1a, the conductive layer 12 and the insulating layer 11 exist. The insulating layer 11 is a layer configured to insulate the housing 10 and the one or more electrodes 3 inserted into the groove V1. For example, the insulating layer 11 of the groove V1a, into which the electrode 3b of the laser oscillation element 30a and the electrode 3a of the laser oscillation element 30b are inserted, insulates between the housing 10, and the electrode 3b of the laser oscillation element 30a and the electrode 3a of the laser oscillation element 30b.

The insulating layer 11 is provided so that the insulating layer 11 is, for example, in contact with a side surface and a bottom surface of the groove V1a.

The conductive layer 12 is provided on the insulating layer 11. The conductive layer 12 is a conductor. The conductive layer 12 of the groove V1a is connected to the electrode 3b of one of the adjacent two laser oscillation elements 30, and the electrode 3a of the other of the two laser oscillation elements 30. That is, the conductive layer 12, which is a conductor, is a layer configured to electrically connect the electrode 3b of one of the adjacent two laser oscillation elements 30, and the electrode 3a of the other of the two laser oscillation elements 30.

The conductive layer 12, for example, is connected to the electrode 3b of the laser oscillation element 30a and the electrode 3a of the laser oscillation element 30b. That is, the conductive layer 12 electrically connects the electrode 3b of the laser oscillation element 30a and the electrode 3a of the laser oscillation element 30b.

Note that the electrode Eda is electrically connected to the electrode 3a of the laser oscillation element 30a. Moreover, the electrode Edb is electrically connected to the electrode 3b of the laser oscillation element 30c. This allows the laser oscillation elements 30a, 30b, 30c to be electrically connected in series between the electrode Eda and the electrode Edb.

A configuration of the region Rg2 in FIG. 2 is similar to the configuration of the region Rg1, which has been described with reference to FIG. 1, and thus, a detailed description is not given.

The fixing member 18 is a member configured to fix the n laser oscillation elements 30 to the housing 10. Specifically, the n laser oscillation elements 30 are fixed to the upper surface 10a of the housing 10 by the fixing member 18. The cooling surface 34b of each of the laser oscillation elements 30 comes into contact with a portion other than the groove V1 in the housing 10. This makes a contact area of the cooling surface 34b of each of the laser oscillation elements 30 larger. This can release heat generated by each of the laser oscillation elements 30 from the back surface 10b through the housing 10.

Note that the back surface 10b of the housing 10 is a flat surface not having any groove, projection, or the like. This can secure a large contact area between the back surface 10b of the housing 10 and a cooling apparatus for heat exhaust. Moreover, since the back surface 10b of the housing 10 is a flat surface, a configuration of the cooling apparatus, assembly of the housing 10 and the cooling apparatus, and the like can be made easier.

As described above, according to the present embodiment, the housing 10 is provided with the groove V1a into which the electrode 3b of the laser oscillation element 30a and the electrode 3a of the laser oscillation element 30b are inserted. Inside the groove V1a, the conductive layer 12 configured to electrically connect the electrode 3b of the laser oscillation element 30a and the electrode 3a of the laser oscillation element 30b exists.

Thereby, the electrode 3b of the laser oscillation element 30a and the electrode 3a of the laser oscillation element 30b are electrically connected inside the groove V1a of the housing 10 without using a substrate. Thus, the laser light source unit having the configuration simplified can be provided. Moreover, with the simple configuration, the plurality of the laser oscillation elements can be held.

Moreover, according to the present embodiment, the configuration is such that the laser oscillation elements 30 are fixed to the housing 10 having the simple shape. This allows a major part of the cooling surface 34b of each of the laser oscillation elements 30 to be joined to the housing 10. The back surface 10b (cooling surface) of the housing 10 of the laser light source unit 100 is a flat surface. Accordingly, the assembly of the housing 10 and the cooling apparatus is easy, and a larger heat release area can be obtained. Thus, the laser light source unit 100 having an excellent heat exhaust characteristic can be provided.

Note that in the case where the light source of the projector or the like is configured, using the plurality of laser oscillation elements, it is necessary to keep a temperature of each of the laser oscillation elements constant for securing stable laser output. Moreover, when the temperature of the laser oscillation element becomes high, the laser output may decrease. Therefore, in order to cool the laser oscillation element, a cooling structure may be added to the laser oscillation element. In this case, it is desirable that a heat exhaust efficiency is high.

Consequently, in the related art A, the following configuration is used. Specifically, in the related art A, a plurality of excitation light sources is provided in a light source holding body, and the plurality of the excitation light sources is electrically connected by a substrate. Moreover, the plurality of excitation light sources abuts on a heat sink.

In this configuration, a space for containing the substrate needs to be provided in the light source apparatus. Moreover, a distance from the excitation light source to the heat sink is large. Therefore, there is a problem that it is difficult to efficiently cool the excitation light source.

Moreover, in the related art B, a configuration in which a support member, a holding member and the like are combined is used. Therefore, the number of parts of the light source apparatus is large, and assembly of the light source apparatus is complicated. Therefore, there is a problem of disadvantage in cost.

Moreover, output of the one laser oscillation element is generally several milliwatts (mW) to several watts (W). That is, the output of the one laser oscillation element is much smaller than output required for the light source of the projector or the like (several tens of watts (W)). Therefore, the one light source is generally configured by arranging the plurality of laser oscillation elements side by side. Note that in order to stably drive the laser oscillation element, the cooling surface of the stem needs to be controlled to have a constant temperature.

However, when in the configuration in which the plural laser oscillation elements are arranged side by side, an electric circuit to supply the current to the two electrodes of each of the laser oscillation elements, and a structure configured to cool the cooling surface of the stem are provided, there is a problem that the configuration becomes complicated.

Consequently, since the laser light source unit 100 of the present embodiment is configured as described above, the above-described problems can be solved.

Second Embodiment

A configuration of the present embodiment is a configuration using solder (hereinafter, also referred to as a "configuration CtA"). In the following description, a laser light source unit to which the configuration CtA is applied is also referred to a "laser light source unit 100A."

Figure 4:
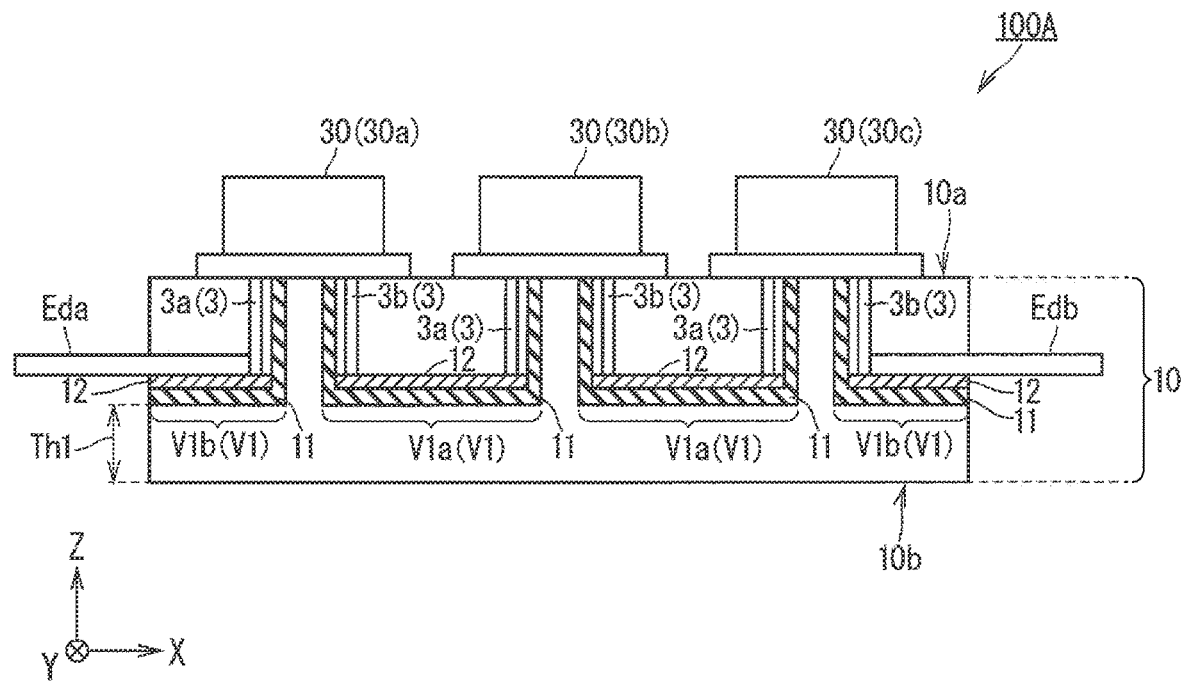
FIG. 4 is a cross-sectional view of a laser light source unit according to a second embodiment of the present invention.

FIG. 4 is a cross-sectional view of a laser light source unit 100A according to a second embodiment of the present invention. The laser light source unit 100A is different from the laser light source unit 100 in FIG. 1 in that it does not include the fixing member 18. Other configurations of the laser light source unit 100A are similar to those of the laser light source unit 100, and thus, detailed descriptions thereof are not repeated.

In the laser light source unit 100A, then laser oscillation elements 30 are joined to the housing 10 by solder (metal). Specifically, the cooling surface 34b of each of the laser oscillation elements 30 of the laser light source unit 100A is joined to the housing 10 by solder. Therefore, in the laser light source unit 100A, the fixing member 18 for fixing each of the laser oscillation elements 30 to the housing 10 is unnecessary.

As described above, according to the present embodiment, since the fixing member 18 is unnecessary, assembly of the laser light source unit 100A can be simplified. This can suppress manufacturing costs of the laser light source unit 100A.

Moreover, since the cooling surface 34b of each of the laser oscillation elements 30 is joined to the housing 10 by the metal such as the solder or the like, the heat generated by each of the laser oscillation elements 30 can be efficiently transmitted to the housing 10. Accordingly, output of each of the laser oscillation elements 30 can be stabilized.

Note that a configuration in which the configuration CtA is applied to the laser light source unit 100 of the first embodiment (hereinafter, also referred to as a "configuration CtNA") may be employed. In the configuration CtNA, the cooling surface 34b of each of the laser oscillation elements 30 is joined to the housing 10 by the solder, and in addition, each of the laser oscillation elements 30 is further fixed to the housing 10 by the fixing member 18. Therefore, in the configuration CtNA, in addition to the effects of the second embodiment, an effect that each of the laser oscillation elements 30 can be firmly fixed to the housing 10 can be obtained.

Third Embodiment

A configuration of the present embodiment is a configuration in which the n laser oscillation elements 30 included by a laser light source unit are connected in series (hereinafter, also referred to as a "configuration CtB"). In the following description, the laser light source unit to which the configuration CtB is applied is also referred to as a "laser light source unit 100B."

The laser light source unit 100B includes the n laser oscillation elements 30. In the present embodiment, "n" is six as one example. In the following description, the n laser oscillation elements 30 included by the laser light source unit 100B are also referred to as "laser oscillation elements 30a, 30b, 30c, 30d, 30e, 30f."

Figure 5:
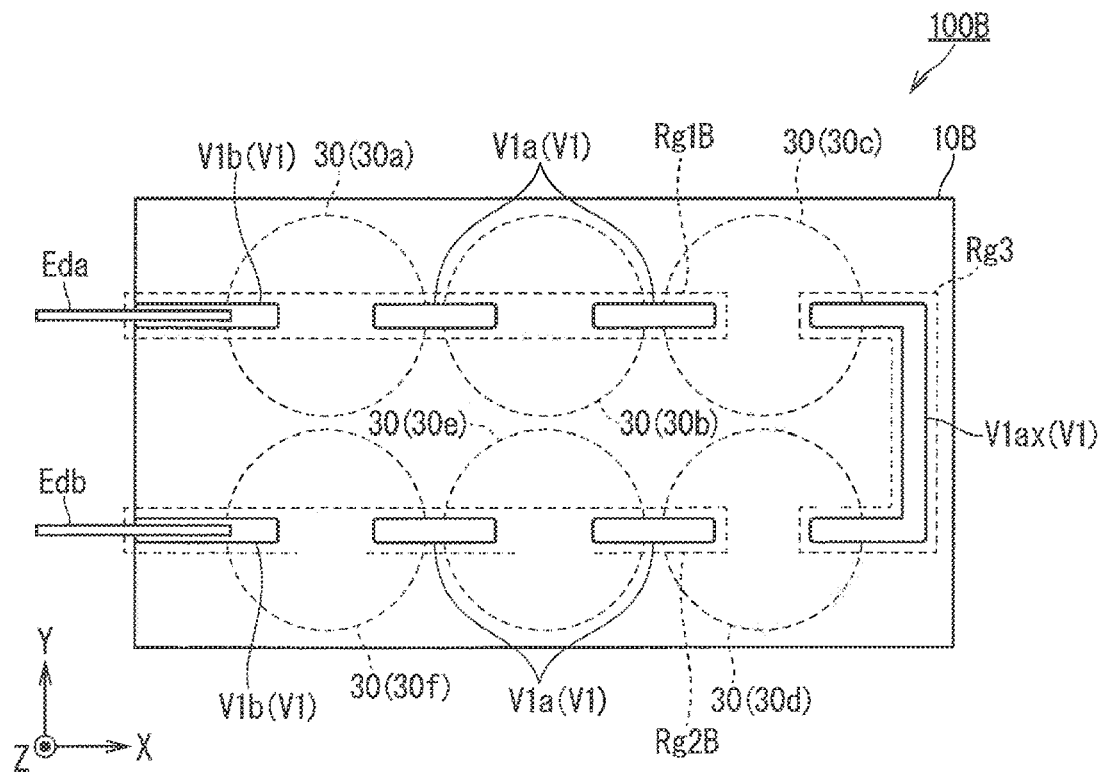
FIG. 5 is a plan view showing a configuration of a laser light source unit according to a third embodiment of the present invention.

FIG. 5 is a plan view showing a configuration of the laser light source unit 100B according to a third embodiment of the present invention. In order to facilitate understanding of features of the third embodiment, in FIG. 5, outlines of the laser oscillation elements 30a, 30b, 30c, 30d, 30e, 30f are indicated by dotted lines, and the fixing member 18 is not shown.

The laser light source unit 100B is different from the laser light source unit 100 in FIGS. 1 and 2 in that it includes a housing 10B in place of the housing 10, that it includes one electrode Eda in place of the two electrodes Eda, that it includes one electrode Edb in place of the two electrodes Edb, that it has regions Rg1B, Rg2B in place of the regions Rg1, Rg2, and that it further has a region Rg3. Other configurations of the laser light source unit 100B are similar to those of the laser light source unit 100, and thus, detailed descriptions thereof are not repeated.

The housing 10B is different from the housing 10 in that two grooves V1b are provided in place of the four grooves V1b, and in that it further has a groove V1ax. Other configurations of the housing 10B are similar to those of the housing 10, and thus, detailed descriptions thereof are not repeated.

Moreover, internal configurations of the two grooves V1b in the housing 10B are similar to those of the grooves V1b of the housing 10 in FIG. 1, and thus, detailed descriptions thereof are not repeated. Moreover, internal configurations of the four grooves V1a in the housing 10B are similar to those of each of the grooves V1a of the housing 10 in FIG. 1, and thus, detailed descriptions thereof are not repeated. That is, inside each of the grooves V1b, and inside each of the grooves V1a, the conductive layer 12 and the insulating layer 11 are provided as in FIG. 1.

The insulating layer 11 is a layer configured to insulate the housing 10B and the more than one electrodes 3 inserted into the groove V1. For example, the insulating layer 11 of the groove V1a, into which the electrode 3b of the laser oscillation element 30a and the electrode 3a of the laser oscillation element 30b are inserted, insulates between the housing 10B, and the electrode 3b of the laser oscillation element 30a and the electrode 3a of the laser oscillation element 30b.

The n laser oscillation elements 30 of the laser light source unit 100B are fixed to the housing 10B by the fixing member 18, as shown in FIG. 1. As described before, each of the n laser oscillation elements 30 is an element configured to drive, utilizing the electrode 3a and the electrode 3b. In the laser light source unit 100B, the n laser oscillation elements 30 (laser oscillation elements 30a, 30b, 30c, 30d, 30e, 300 are electrically connected in series between the one electrode Eda and the one electrode Edb.

The region Rg1B is different from the region Rg1 in FIG. 2 in that it includes the one groove V1b in place of the two grooves V1b. That is, in the region Rg1B, the one groove V1b and the two grooves V1a are provided.

The laser oscillation elements 30a, 30b are fixed to the one groove V1b and the two grooves V1a in the region Rg1B as in FIG. 1. For example, the electrode 3a of the laser oscillation element 30a is inserted into the groove V1b of the region Rg1B. The electrode 3a of the laser oscillation element 30a is electrically connected to the one electrode Eda.

Moreover, in the region Rg1B, for example, the electrode 3b of the laser oscillation element 30a and the electrode 3a of the laser oscillation element 30b are inserted into the left groove V1a of the two grooves V1a. Note that the electrode 3b of the laser oscillation element 30a and the electrode 3a of the laser oscillation element 30b are electrically connected by the conductive layer 12.

The region Rg3 includes the groove V1ax. A shape of the groove V1ax is a U shape as one example. The electrode 3b of the laser oscillation element 30c and the electrode 3a of the laser oscillation element 30d are inserted into the groove V1ax. Inside the groove V1ax, the conductive layer 12 and the insulating layer 11 are provided as in the groove V1a. The conductive layer 12 of the groove V1ax electrically connects the two electrodes 3 inserted into the groove V1ax. That is, the conductive layer 12 of the groove V1ax electrically connects the electrode 3b of the laser oscillation element 30c and the electrode 3a of the laser oscillation element 30d.

The region Rg2B is different from the region Rg2 in FIG. 2 in that it includes the one groove V1b in place of the two grooves V1b. That is, in the region Rg2B, the one groove V1b and the two grooves V1a are provided. The laser oscillation elements 30d, 30e, 30f electrically connected in series are fixed to the one groove V1b and the two grooves V1a in the region Rg2B. For example, the electrode 3b of the laser oscillation element 30f is inserted into the groove V1b of the region Rg2B. The electrode 3b of the laser oscillation element 30f is electrically connected to the one electrode Edb in the region Rg2B.

Moreover, in the region Rg2B, for example, the electrode 3b of the laser oscillation element 30d and the electrode 3a of the laser oscillation element 30e are inserted into the right groove V1a of the two grooves V1a.

As described above, according to the present embodiment, the n laser oscillation elements 30 are electrically connected in series between the one electrode Eda and the one electrode Edb. That is, the use of the one electrode Eda and the one electrode Edb allows current to be supplied to the n laser oscillation elements 30 of the laser light source unit 100B. That is, only two terminals for supplying the current to the laser light source unit 100B from an outside are required.

This can simplify the configuration of the laser light source unit 100B. Therefore, an interface when the laser light source unit is incorporated into the projector (projection-type display apparatus) can be simplified. Accordingly, a degree of freedom of disposition of the laser light source unit inside the projector (projection-type display apparatus) can be increased.

Note that a configuration in which the foregoing configuration CtA is applied to the configuration CtB of the present embodiment (hereinafter, also referred to as a "configuration CtBa") may be employed. In the configuration CtBa, the n laser oscillation elements 30 are joined to the housing 10B by solder (metal). Moreover, in the configuration CtBa, the fixing member 18 is not used.

Moreover, a configuration in which in the configuration CtBa, the fixing member 18 is used (hereinafter, also referred to as a "configuration CtNBa") may be employed. In the configuration CtNBa, each of the laser oscillation elements 30 is fixed to the housing 10B by solder (metal) and the fixing member 18.

Fourth Embodiment

A configuration of the present embodiment is a configuration in which the functions of insulation, electrical conduction and the like can be added to a housing (hereinafter, referred to as a "configuration CtC"). In the following description, a laser light source unit to which the configuration CtC is applied is also referred to as a "laser light source unit 100C."

FIG. 6 is a perspective view showing a part of the configuration of the laser light source unit 100C according to a fourth embodiment of the present invention. The laser light source unit 100C is different from the laser light source unit 100 in FIG. 1 in that it includes a housing 10N in place of the housing 10, and that it includes a plurality of parts 50. Other configurations of the laser light source unit 100C are similar to those of the laser light source unit 100, and thus, detailed descriptions thereof are not repeated.

The housing 10N is different from the housing 10 in that inside of each of the grooves V1a, the conductive layer 12 and the insulating layer 11 do not exist. Other configurations and functions of the housing 10N are similar to those of the housing 10, and thus, detailed descriptions thereof are not repeated. The housing 10N is a part formed only by machining.

Figure 7A:
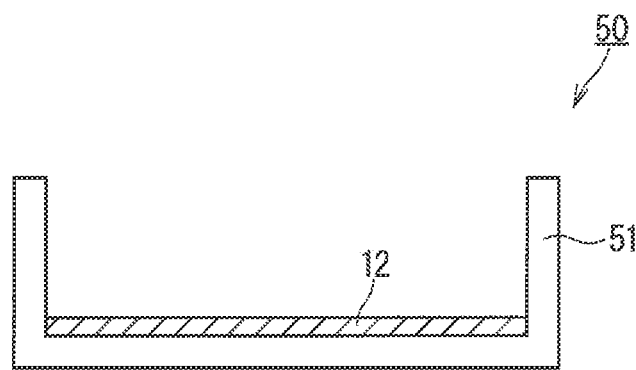
FIGS. 7A and 7B are cross-sectional views each showing a part according to the fourth embodiment of the present invention.
Figure 7B:
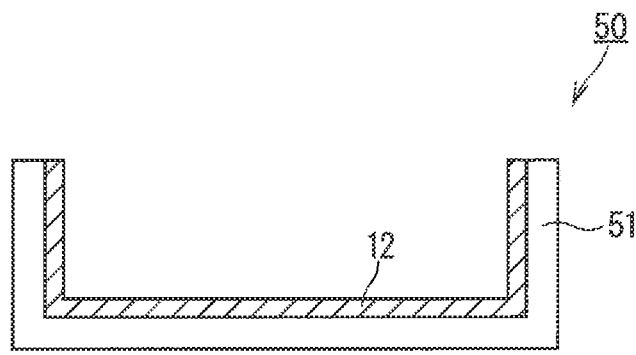

Next, a description of the parts 50 is given. FIGS. 7A and 7B are cross-sectional views each showing the part 50 according to the fourth embodiment of the present invention. The part 50 has, for example, a configuration shown in FIG. 7A. Referring to FIGS. 6 and 7A, a shape of the part 50 is a box shape having a bottom and no lid.

The part 50 includes a member 51 and the conductive layer 12. A shape of the member 51 is a box shape having a bottom and no lid. The member 51 is made of an insulating material. The insulating material is, for example, plastic, silicon or the like. In a part (bottom surface) of an inside of the member 51, the conductive layer 12 is formed as shown in FIG. 7A.

A configuration of the part 50 is not limited to the configuration in FIG. 7A. The configuration of the part 50 may be, for example, a configuration in FIG. 7B. That is, as shown in FIG. 7B, in the whole inside of the member 51 of the part 50, the conductive layer 12 may be formed.

The part 50 is inserted into each of the grooves V1a of the housing 10N from an outside of the housing 10N. In the following description, a state of the housing 10N where the part 50 is inserted into each of the grooves V1a of the housing 10N is also referred to as a "state St1." In each of the grooves V1a of the housing 10N in the state St1, the member 51 and the conductive layer 12 exist.

That is, the conductive layer 12 existing in each of the grooves V1a of the housing 10N in the state St1 has been inserted into the groove V1a from the outside of the housing 10N. Moreover, as described before, the member 51 is made of the insulating material. Therefore, the member 51 of the housing 10N in the state St1 functions as an insulating layer. That is, the member 51 as the insulating layer, which exists in each of the grooves V1a of the housing 10N in the state St1, has been inserted into the groove V1a from the outside of the housing 10N. Accordingly, the housing 10N in the state St1 has the conductive layer 12 and the insulating layer (member 51) as in the housing 10 of FIG. 1.

In the laser light source unit 100C, as in the laser light source unit 100 of FIG. 1, the n laser oscillation elements 30 are fixed to the housing 10N in the state St1 by the fixing member 18. Therefore, the conductive layer 12 and the insulating layer (member 51) existing in the housing 10N in the state St1 have functions similar to those of the conductive layer 12 and the insulating layer 11 of the housing 10, respectively.

For example, the conductive layer 12 of the part 50 inserted into the groove V1a existing in the housing 10N in the state St1 electrically connects the electrode 3b of the laser oscillation element 30a and the electrode 3a of the laser oscillation element 30b. Moreover, for example, the insulating layer (member 51) of the part 50 inserted into the groove V1a existing in the housing 10N in the state St1 insulates between the housing 10N, and the electrode 3b of the laser oscillation element 30a and the electrode 3a of the laser oscillation element 30b.

As described above, according to the present embodiment, the housing 10N is formed only by machining, and the part 50 has the functions of insulation and the electrical conduction. This makes the processing of the parts of the housing 10N and the like easy. Moreover, the configuration of the housing 10N itself can be simplified. This can suppress costs of the laser light source unit 100C.

Moreover, by employing the simple configuration in which the parts 50 are inserted into the grooves V1a of the housing 10N, assembly work can be made easier.

Note that a configuration in which the foregoing configuration CtA is applied to the configuration CtC of the present embodiment (hereinafter, also referred to as a "configuration CtCa") may be employed. In the configuration CtCa, the n laser oscillation elements 30 are joined to the housing 10N in the state St1 by solder (metal). Moreover, in the configuration CtCa, the fixing member 18 is not used.

Moreover, a configuration in which in the configuration CtCa, the fixing member 18 is used (hereinafter, also referred to as a "configuration CtNCa") may be employed. In the configuration CtNCa, each of the laser oscillation elements 30 is fixed to the housing 10N in the state St1 by the fixing member 18.

<First Modification>

A configuration of the present modification is a configuration in which a material of the housing of the laser light source unit is metal excellent in heat conduction (hereinafter, also referred to as a "configuration CtX"). The metal excellent in heat conduction is, for example, aluminum, copper, or the like. The configuration CtX can be applied to the configurations of the first to fourth embodiments.

In the following description, a configuration in which the configuration CtX is applied to the laser light source unit 100 of the first embodiment is also referred to as a "configuration Ct1x." The housing 10 of the laser light source unit 100 in the configuration Ct1x is made of aluminum or copper.

According to the configuration Ct1x, the heat generated by the laser oscillation elements 30 can be efficiently transmitted to the back surface 10b (cooling surface) of the housing 10. Therefore, the housing excellent in cooling performance can be realized. Accordingly, the heat transmitted to the back surface 10b (cooling surface) can be exhausted by the cooling apparatus not shown.

A thickness Th1 of the housing 10 in FIG. 1 is decided in view of a rigidity, an efficiency of the heat conduction, and the like of the housing 10. Generally, as the thickness Th1 becomes larger, a heat resistance due to heat transmission increases, and the heat exhaust efficiency of the housing 10 decreases. Moreover, as the thickness Th1 becomes smaller, the rigidity of the housing 10 decreases. In this case, an emission direction of a laser beam is not stable, and a utilization efficiency in an optical system not shown of the projection-type display apparatus decreases. Therefore, it is desirable that the thickness Th1 is about 3 millimeters to 5 millimeters.

According to the present modification described above, the housing 10 is made of the metal excellent in heat conduction. Therefore, the plurality of laser oscillation elements 30 can be efficiently cooled simultaneously.

In the following description, a configuration in which the configuration CtX is applied to the configuration CtA of the second embodiment is also referred to as a "configuration CtAx." The housing 10 of the laser light source unit 100A in the configuration CtAx is made of aluminum or copper. Moreover, the configuration CtX may be applied to the configuration CtNA of the second embodiment.

Moreover, in the following description, a configuration in which the configuration CtX is applied to the configuration CtB of the third embodiment is also referred to as a "configuration CtBx." The housing 10B of the laser light source unit 100B in the configuration CtBx is made of aluminum or copper. Moreover, the configuration CtX may be applied to the configuration CtBa of the third embodiment. Moreover, the configuration CtX may be applied to the configuration CtNBa of the third embodiment.

In the following description, a configuration in which the configuration CtX is applied to the configuration CtC of the fourth embodiment is also referred to as a "configuration CtCx." The housing 10N of the laser light source unit 100C in the configuration CtCx is made of aluminum or copper. Moreover, the configuration CtX may be applied to the configuration CtCa of the fourth embodiment. Moreover, the configuration CtX may be applied to the configuration CtNCa of the fourth embodiment.

Note that the present invention is not limited only to the embodiments, and the modification described above. It should be noted that, within the scope of the present invention, the embodiments and the modification of the present invention may be freely combined, and/or may be appropriately modified or omitted.

For example, the arrangement state of the n laser oscillation elements 30 are not limited to, for example, the state in FIG. 2.

Although the present invention has been described in detail, the above description is illustrative in all aspects, and the present invention is not limited thereto. It is understood that innumerable modifications not illustrated can be envisaged without departing from the scope of the present invention.

EXPLANATION OF REFERENCE SIGNS 3, 3a, 3b, Eda, Edb: electrode
10, 10B, 10N: housing
11: insulating layer
12: conductive layer
18: fixing member
30, 30a, 30b, 30c, 30d, 30e, 30f: laser oscillation element
100, 100A, 100B, 100C: laser light source unit
V1, V1a, V1ax, V1b: groove

The invention claimed is:

1. A laser light source unit comprising:
    first and second laser oscillation elements; and
    a housing configured to hold the first and second laser oscillation elements,
    wherein
    each of the first and second oscillation elements has a first electrode and a second electrode,
    the housing is provided with a groove into which the second electrode of the first laser oscillation element, and the first electrode of the second laser oscillation element are inserted,
    inside the groove, a conductive layer exists, the conductive layer being configured to electrically connect the second electrode of the first laser oscillation element, and the first electrode of the second laser oscillation element, and
    wherein the housing is made of aluminum or copper.

2. The laser light source unit according to claim 1, wherein the conductive layer is inserted into the groove from an outside of the housing.

3. The laser light source unit according to claim 1, wherein inside the groove, an insulating layer configured to insulate between the housing, and the second electrode of the first laser oscillation element and the first electrode of the second laser oscillation element exists.

4. The laser light source unit according to claim 3, wherein the insulating layer is inserted into the groove from the outside of the housing.

5. The laser light source unit according to claim 1, further comprising a fixing member configured to fix the first and second laser oscillation elements to the housing.

6. The laser light source unit according to claim 1, wherein the first and second laser oscillation elements are joined to the housing by solder.

7. The laser light source unit according to claim 1, comprising a plurality of laser oscillation elements including the first and second laser oscillation elements,
    wherein
    the plurality of laser oscillation elements is fixed to the housing,
    each laser oscillation element of the plurality of laser oscillation elements has the first electrode and the second electrode,
    each laser oscillation element of the plurality of laser oscillation elements is an element configured to drive, utilizing the first electrode and the second electrode, and
    the plurality of laser oscillation elements is electrically connected in series.

8. A laser light source unit comprising:
    first and second laser oscillation elements; and
    a housing configured to hold the first and second laser oscillation elements,
    wherein
    each of the first and second oscillation elements has a first electrode and a second electrode,
    the housing is provided with a groove into which the second electrode of the first laser oscillation element, and the first electrode of the second laser oscillation element are inserted,
    inside the groove, a conductive layer exists, the conductive layer being configured to electrically connect the second electrode of the first laser oscillation element, and the first electrode of the second laser oscillation element, and
    wherein inside the groove, an insulating layer configured to insulate between the housing, and the second electrode of the first laser oscillation element and the first electrode of the second laser oscillation element exists.

9. The laser light source unit according to claim 8, wherein the insulating layer is inserted into the groove from the outside of the housing.

* * * * *